US008218688B2

(12) United States Patent
Murofushi et al.

(10) Patent No.: US 8,218,688 B2
(45) Date of Patent: Jul. 10, 2012

(54) QUADRATURE DEMODULATOR AND INTERROGATOR

(75) Inventors: Nobuo Murofushi, Susono (JP); Sadatoshi Oishi, Fuji (JP)

(73) Assignee: Toshiba Tec Kabushiki Kaisha (JP)

( * ) Notice: Subject to any disclaimer, the term of this patent is extended or adjusted under 35 U.S.C. 154(b) by 977 days.

(21) Appl. No.: 12/215,209

(22) Filed: Jun. 25, 2008

(65) Prior Publication Data

US 2008/0266059 A1 Oct. 30, 2008

Related U.S. Application Data

(63) Continuation of application No. PCT/JP2007/053070, filed on Feb. 20, 2007.

(30) Foreign Application Priority Data

Feb. 24, 2006 (JP) ................................. 2006-048767

(51) Int. Cl.
*H04L 27/00* (2006.01)
(52) U.S. Cl. ...................................... 375/324; 455/41.2
(58) Field of Classification Search .................. 375/324, 375/329, 316; 329/304, 306, 308; 455/41.2, 455/86
See application file for complete search history.

(56) References Cited

U.S. PATENT DOCUMENTS

| 6,122,329 | A | 9/2000 | Zai et al. |
| 6,501,807 | B1 | 12/2002 | Chieu et al. |
| 7,486,131 | B2 | 2/2009 | Murofushi et al. |
| 2005/0231367 | A1* | 10/2005 | Bellantoni ............... 340/572.1 |
| 2006/0238301 | A1* | 10/2006 | Wu et al. ...................... 340/10.1 |
| 2007/0177694 | A1* | 8/2007 | Okunev et al. ................ 375/333 |
| 2011/0133895 | A1* | 6/2011 | Wu et al. ...................... 340/10.1 |

FOREIGN PATENT DOCUMENTS

| JP | 6-244754 | 9/1994 |
| JP | 8-69583 | 3/1996 |
| JP | 8-223230 | 8/1996 |
| JP | 11-298366 | 10/1999 |
| JP | 2004-140681 | 5/2004 |
| JP | 2004-147016 | 5/2004 |

OTHER PUBLICATIONS

Translation of International Preliminary Report on Patentability for PCT/JP2007/053070 dated Oct. 9, 2008.
International Search Report for PCT/JP2007/053070 dated Mar. 13, 2007.

* cited by examiner

*Primary Examiner* — Chieh M. Fan
*Assistant Examiner* — Freshteh N Aghdam
(74) *Attorney, Agent, or Firm* — Harness, Dickey & Pierce, P.L.C.

(57) ABSTRACT

A quadrature demodulator generates an I-signal from a modulated reception signal and a local signal, generates a Q-signal from the local signal and the local signal having a phase shifted through 90 degrees. Capacitors remove DC components from the I- and Q-signals. Low-pass filters remove frequency components higher than the frequencies of the I- and Q-signals. An I-signal squaring section squares the I-signal having passed through the low-pass filters. A Q-signal squaring section squares the Q-signal having passed through the low-pass filters. An adding section adds the squared I-signal and the squared Q-signal together. A comparator then compares the level of an S1 signal resulting from the addition with a threshold to obtain an S2 signal. A data generating section of a digital signal processing section executes a process of inverting the signal level of the S2 signal at every rising edge of the S2 signal to demodulate reception data.

14 Claims, 5 Drawing Sheets

QUADRATURE DEMODULATOR AND INTERROGATOR

CROSS REFERENCE TO RELATED APPLICATIONS

This is a Continuation Application of PCT Application No. PCT/JP2007/053070, filed Feb. 20, 2007, which was published under PCT Article 21(2) in Japanese.

This application is based upon and claims the benefit of priority from prior Japanese Patent Application No. 2006-048767, filed Feb. 24, 2006, the entire contents of which are incorporated herein by reference.

BACKGROUND OF THE INVENTION

1. Field of the Invention

The present invention relates to a quadrature demodulator that creates an I-signal and a Q-signal with a baseband to demodulate a received signal, and an interrogator comprising the quadrature demodulator.

2. Description of the Related Art

An interrogator is a radio communication device that makes radio communications with a transponder called a radio tag or a radio-frequency identification (RFID) tag. The interrogator uses a modulated radio signal to transmit information to the RFID tag, and after the transmission of the information, continues to transmit an unmodulated signal. In contrast, the RFID tag changes the amount of reflection in the unmodulated signal from the interrogator for backscatter modulation and transmits the resultant information to the interrogator. The interrogator receives the backscatter modulation wave to read the information from the RFID tag.

The interrogator comprises a transmission section and a reception section. On the transmission side, a modulator modulates the information, and an amplifier amplifies the modulated information and then transmits the information from an antenna. On the reception side, the antenna receives the signal, and a direct-conversion quadrature demodulator extracts a baseband signal from the high-frequency signal, and demodulates the baseband signal to extract information from the signal.

The direct-conversion quadrature demodulator inputs the reception signal and a local signal of the same frequency as that of a carrier for the reception signal, to a mixer to create an in-phase (I) signal with the baseband. The direct-conversion quadrature demodulator inputs the reception signal and a signal out of phase with the local signal by 90 degrees, to the mixer to create a quadrature-phase (Q) signal with the baseband.

The amplitudes of the I- and Q-signals depend on the phase difference between reception signal and the local signal. The amplitude of the Q-signal is minimized by maximizing the amplitude of the I-signal. The amplitude of the Q-signal is maximized by minimizing the amplitude of the I-signal. When the Q-signal has the minimum amplitude of zero, the I-signal has the maximum amplitude, and reception data can thus be reproduced using this I-signal. In contrast, when the I-signal has the minimum amplitude of zero, the Q-signal has the maximum amplitude, and the reception data can thus be reproduced using this Q-signal. The phases of the I- and Q-signals may be inverted depending on the phase difference between the reception signal and the local signal.

As a method of reproducing the reception data using such a direct-conversion quadrature demodulator, a method is known which reproduces the reception data by selecting one of the I- and Q-signals which has a greater amplitude (see, for example, U.S. Pat. No. 6,501,807 B1).

The reproduction method described in U.S. Pat. No. 6,501,807 B1 reproduces the reception data by comparing the amplitudes of the I- and Q-signals with each other to select one of the I- and Q-signals which has the greater amplitude. Thus, when the amplitude of the I-signal is markedly different from that of the Q-signal, the reproduction is prevented from being affected because the selected signal has the large amplitude. However, if the I- and Q-signals have almost the same amplitude, either of the signals may be selected, but the reception data needs to be reproduced at an amplitude that is half that of the reception signal. Thus, when the reception signal is at a low level, the signal is likely to be affected by noise. Thus, disadvantageously, the reception data is often erroneously reproduced by the noise.

BRIEF SUMMARY OF THE INVENTION

Thus, an object of the present invention is to provide a quadrature demodulator that can minimize the adverse effects of noise even with the reduced level of a reception signal, enabling a reduction in the erroneous reproduction of reception data caused by the noise, as well as an interrogator comprising the quadrature demodulator.

According to an aspect of the present invention, there is provided a quadrature demodulator which mixes a two-level-form modulated reception signal with a local signal to generate an I-signal, mixes the reception signal with the local signal having a phase shifted through 90 degrees to generate a Q-signal, and generates two-level-form data from the I-signal and the Q-signal, the quadrature demodulator comprising: an I-signal DC component removing section which removes a DC component from the I-signal; an I-signal low-pass filter which removes a frequency component which is higher than a frequency of the I-signal; an I-signal squaring section which squares the I-signal having passed through the I-signal DC component removing section and the I-signal low-pass filter; a Q-signal DC component removing section which removes a DC component from the Q-signal; a Q-signal low-pass filter which removes a frequency component which is higher than a frequency of the Q-signal; a Q-signal squaring section which squares the Q-signal having passed through the Q-signal DC component removing section and the Q-signal low-pass filter; an adding section which adds an output from the I-signal squaring section and an output from the Q-signal squaring section together; and a data generating section which generates two-level-form data whose signal level is inverted every time one of a rising edge and a falling edge occurs in the signal output by the adding section, the rising edge and falling edge each passing a predetermined threshold.

According to another aspect of the invention, there is provided an interrogator comprising: a reception section having a quadrature demodulator which mixes a two-level-form modulated reception signal with a local signal to generate an I-signal, mixes the reception signal with the local signal having a phase shifted through 90 degrees to generate a Q-signal, and generates two-level-form data from the I-signal and the Q-signal; a transmission section which transmits a modulated wave and an unmodulated wave; and an antenna shared by the reception section and the transmission section; wherein the demodulator includes: an I-signal DC component removing section which removes a DC component from the I-signal; an I-signal low-pass filter which removes a frequency component which is higher than a frequency of the I-signal; an I-signal squaring section which squares the I-signal having passed through the I-signal DC component removing section and the I-signal low-pass filter; a Q-signal DC component removing section which removes a DC component from the Q-signal; a Q-signal low-pass filter which removes a frequency component which is higher than a frequency of the Q-signal; a Q-signal squaring section which squares the Q-signal having passed through the Q-signal DC component removing section and the Q-signal low-pass filter; an adding section which adds an output from the I-signal squaring section and an output from the Q-signal squaring section together; and a data generating section which generates two-level-form data whose signal level is inverted every time one of a rising edge and a falling edge occurs in the signal output by the adding section, the rising edge and falling edge each passing a predetermined threshold.

With the present invention, the quadrature demodulator and the interrogator can minimize the adverse effects of possible noise even with the reduced level of a reception signal, and enables a reduction in the erroneous reproduction of reception data caused by the noise.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be described below with reference to the drawings.

First Embodiment

Figure 1:
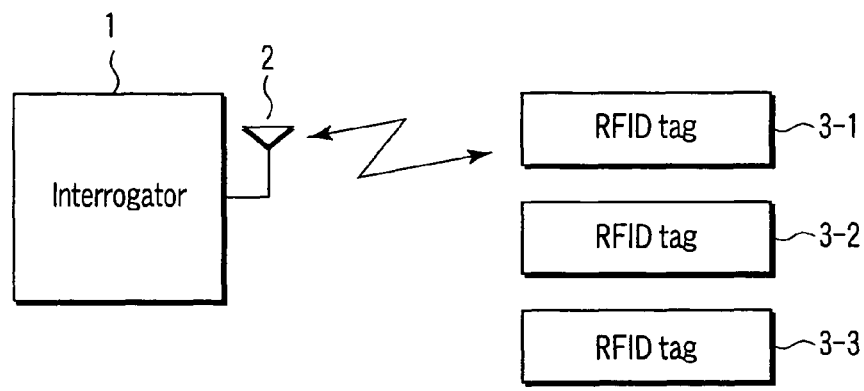
FIG. 1 is a block diagram schematically showing the configuration of a system according to a first embodiment of the present invention.

FIG. 1 is a block diagram schematically showing a system made up of an interrogator and an RFID tag that is a responder. The interrogator 1 comprises an antenna 2. The antenna 2 performs, for transmission, an operation of emitting a high-frequency signal as an electromagnetic wave, and for reception, an operation of receiving an electromagnetic wave to convert the electromagnetic wave into a high-frequency signal.

The electromagnetic wave emitted from the antenna 2 reaches RFID tags 3-1, 3-2, and 3-3, each of which receives the electromagnetic wave. The RFID tags 3-1, 3-2, and 3-3 store respective unique identification numbers.

When the interrogator 1 transmits a signal for interrogation, each of the RFID tags 3-1, 3-2, and 3-3 performs an operation corresponding to the signal for interrogation. For example, if the signal for interrogation contains only data for the identification number corresponding to the RFID tag 3-1, only the RFID tag 3-1 responds, whereas the RFID tags 3-2 and 3-3 do not respond.

To transmit the signal for interrogation to the RFID tag, the interrogator 1 emits a high-frequency signal modulated by the transmission signal, from the antenna 2. After completing the transmission with respect to the transmission signal, the interrogator 1 continues to transmit an unmodulated high-frequency signal made up only of a carrier. Upon receiving the high-frequency signal modulated by the interrogator 1, the RFID tag 3-1 modulates the carrier in accordance with a reply signal. That is, the RFID tag 3-1 performs backscatter modulation on the received carrier to send the replay signal back to the interrogator 1.

While transmitting the unmodulated carrier, the interrogator 1 receives the signal subjected to the backscatter modulation and receives information from the RFID tag 3-1. Thus, in the system made up of the interrogator and the RFID tags, the interrogator and each of the RFID tags exchange information with each other.

Figure 2:
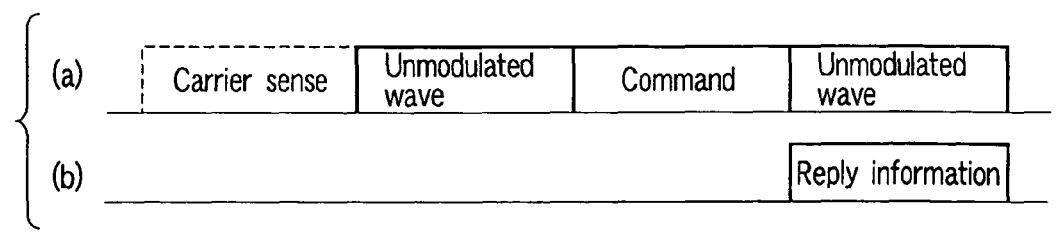
FIG. 2 is a diagram showing a communication format for an interrogator and an RFID tag according to the first embodiment.

FIG. 2 is a diagram showing a communication format for the interrogator 1 and the RFID tags 3-1, 3-2, and 3-3. (a) of FIG. 2 shows a format for the signal transmitted by the interrogator 1. (b) of FIG. 2 shows a format for the signal transmitted by the RFID tag.

First, interrogator 1 performs a carrier sensing operation to check whether or not any surrounding interrogator is emitting an electromagnetic wave. This is to avoid radio interference. Upon confirming that none of the surrounding interrogators are emitting an electromagnetic wave, the interrogator 1 transmits an unmodulated wave. When the interrogator 1 transmits the unmodulated wave, the RFID tags 3-1, 3-2, and 3-3 are actuated using the received unmodulated wave as a power supply.

After the transmission of the unmodulated wave, the interrogator 1 transmits a command to the RFID tags 3-1, 3-2, and 3-3. After completing the transmission of the command, the interrogator continues to transmit an unmodulated wave again. The RFID tag specified in the command subjects the unmodulated wave to backscatter modulation to transmit reply information corresponding to the received command to the interrogator 1. Upon receiving the reply information from the RFID tag, the interrogator 1 stops transmitting the unmodulated wave. When the interrogator 1 stops transmitting an electromagnetic wave, the RFID tag stops operating.

Figure 3:
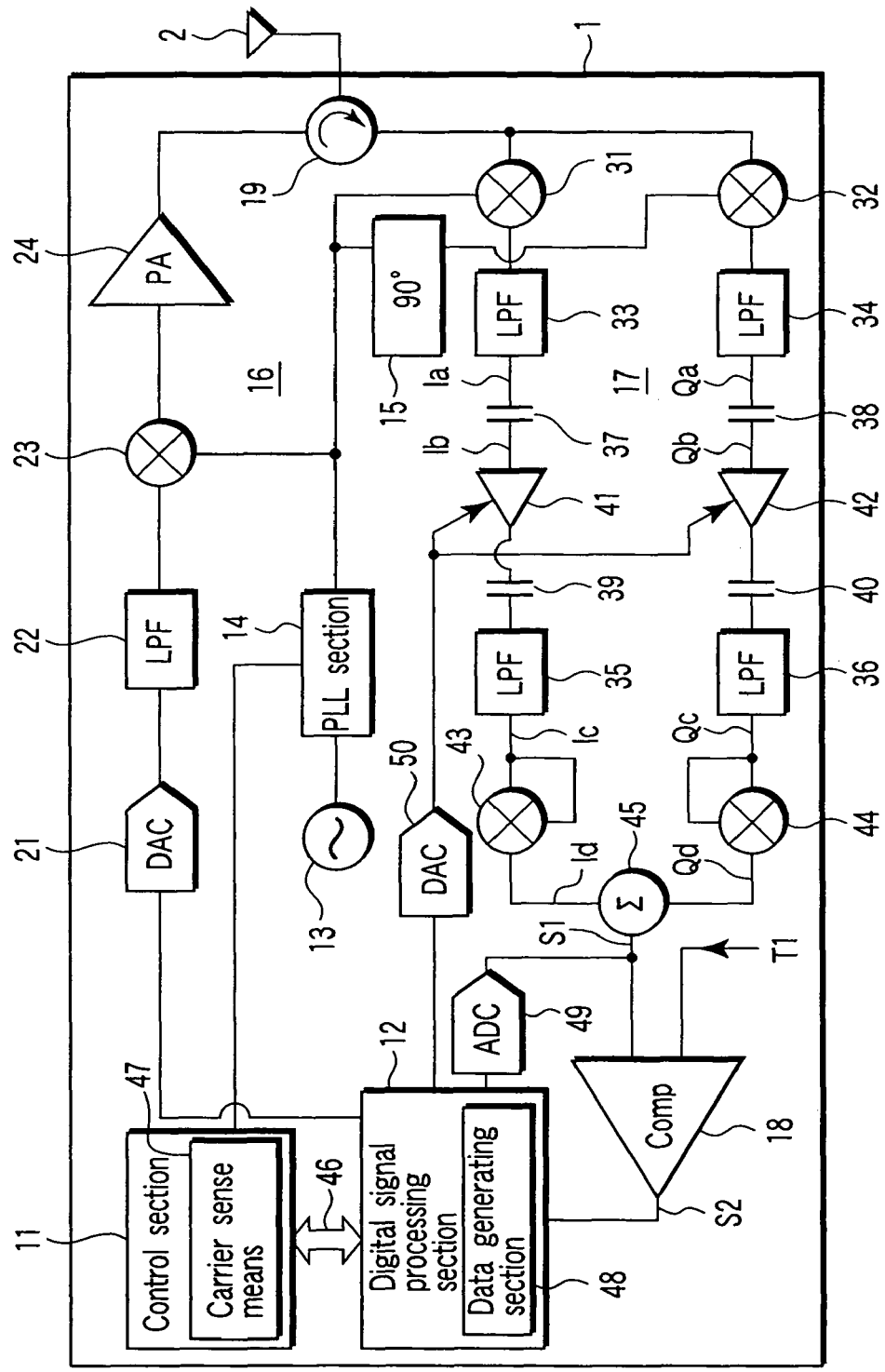
FIG. 3 is a block diagram showing the configuration of the interrogator according to the first embodiment.

The interrogator 1 is configured as shown in FIG. 3. That is, the interrogator 1 has a control section 11, a digital signal processing section 12, an oscillator 13 that generates a reference clock, a phase-locked loop (PLL) section 14 to which the reference clock from the oscillator 13 is input and which outputs a local frequency corresponding to a value set by the control section 11, a 90-degree phase shifter 15 that shifts the phase of the local signal transmitted from the PLL section 14, through 90 degrees, a transmission section 16, a reception section 17, a comparator 18, and a circulator 19. The circulator 19 connects to an output end of the transmission section 15 and to an input end of the reception section 16. The circulator 19 is connected to the antenna 2.

The transmission section 16 is composed of a digital-to-analog converter (DAC) 21, a first low-pass filter (LPF) 22, a first mixer 23, and a power amplifier 24.

The reception section 17 is composed of a second mixer 31 and a third mixer 32, a second low-pass filter (LPF) 33, a third LPF 34, a fourth LPF 35, and a fifth LPF 36, a first capacitor 37, a second capacitor 38, a third capacitor 39, and a fourth capacitor 40, an I-signal variable gain amplifier 41, a Q-signal variable gain amplifier 42, an I-signal squaring section 43 made up of a multiplier, a Q-signal squaring section 44 made up of a multiplier, an adding section 45 made up of an adder, an analog-to-digital converter (ADC) 49, and a digital-to-analog converter (DAC) 50.

The fourth LPF 35 constitutes an I-signal LPF that removes frequency components higher than the frequency of the I-signal. The fifth LPF 36 constitutes a Q-signal LPF that removes frequency components higher than the frequency of the Q-signal. Furthermore, either of the first and third capacitors 37 and 39 may remove DC components from the I-signal and constitutes an I-signal DC component removing section in order to provide a function of removing the DC components. Either of the second and fourth capacitors 38 and 40 may remove DC components from the Q-signal and constitutes a Q-signal DC component removing section in order to provide a function of removing the DC component.

The reception section 17, the comparator 18, and the digital signal processing section 12 constitute the quadrature demodulator.

The control section 11 includes a central processing unit (CPU) and a memory and operates in accordance with pre-stored programs. The control section 11 is connected to the digital signal processing section 12 via a bus line 46 to output transmission data to the digital signal processing section 12. The control section 11 extracts reception data output by the digital signal processing section 12 to exchange data with the RFID tag.

Furthermore, the control section 11 controls the PLL section 14 so that the PLL section outputs a local frequency that is the same as the carrier frequency. Furthermore, the control section 11 has a function of making wired communications with a higher instrument such as a personal computer (not shown).

The digital signal processing section 12 encodes and converts transmission data that is serial data output by the control section 11, into parallel data. The digital signal processing section 12 uses a digital filter such as a finite impulse response (FIR) filter to subject the parallel data to band limitation. The digital signal processing section 12 outputs the resultant data to the DAC 21. Furthermore, the digital signal processing section 12 executes signal processing on the serial data input by the comparator 18 for decoding and outputs the resultant serial reception data to the control section 11. Moreover, a signal output by the adding section 45 is digitized by ADC 49, and the digitized signal is input to the digital signal processing section 12. In accordance with the amplitude of the digitized signal, the digital signal processing section 12 controls an output voltage from DAC 50 and thus the gains of the variable gain amplifiers 41 and 42.

Furthermore, when the digital signal output by ADC 49 is input to the digital signal processing section 12, the digital signal processing section 12 outputs the signal to the control section 11. The control section 11 has carrier sense means 47, and on the basis of amplification factors of the variable gain amplifiers 41 and 42 and the amplitude of the signal from ADC 49, acquires a received signal strength indicator (RSSI) that is the reception signal electric field strength of the received signal. The control section 11 performs a carrier sensing operation of detecting the status of surrounding electromagnetic waves on the basis of the RSSI value.

For transmission, DAC 21 converts input parallel data into an analog baseband signal and then outputs the signal to the first LPF 22. The first LPF 22 removes sampling frequency components for use by DAC 21, from the input signal and outputs the resultant signal to the first mixer 23.

The first mixer 23 mixes the signal output by the first LPF 22 with the local signal output by the PLL section 14 for modulation. The first mixer 23 then outputs the modulated signal to the power amplifier 24. The power amplifier 24 amplifies the power of the modulation signal and outputs the resultant signal to the circulator 19. The circulator 19 outputs the modulation signal to the antenna 2, which emits the signal to space as an electromagnetic wave.

For reception, the antenna 2 receives the signal subjected to the backscatter modulation by the RFID tag. The reception signal passes through the circulator 19 and is input to each of the second and third mixers 31 and 32.

The second mixer 31 mixes the reception signal subjected to the backscatter modulation with the local signal from the PLL section 14 to output the I-signal. The I-signal is input to the second LPF 33, which then removes high frequency components from the signal to output a baseband signal Ia shown in (a) of FIG. 4. The third mixer 32 mixes the reception signal subjected to the backscatter modulation with a signal obtained by allowing the 90-degree phase shifter 15 to shift the phase of the local signal through 90 degrees, to output the Q-signal. The Q-signal is input to the third LPF 34, which then removes high frequency components from the signal to output a baseband signal Qa shown in (b) of FIG. 4.

Here, the baseband signals Ia and Qa have opposite phases but may have the same phase depending on the phase difference between the reception signal and the local signal. Furthermore, in this case, the signal Ia has a greater amplitude than the signal Qa. However, the signal Qa may have a greater amplitude than the signal Ia depending on the phase difference between the reception signal and the local signal.

Figure 4:
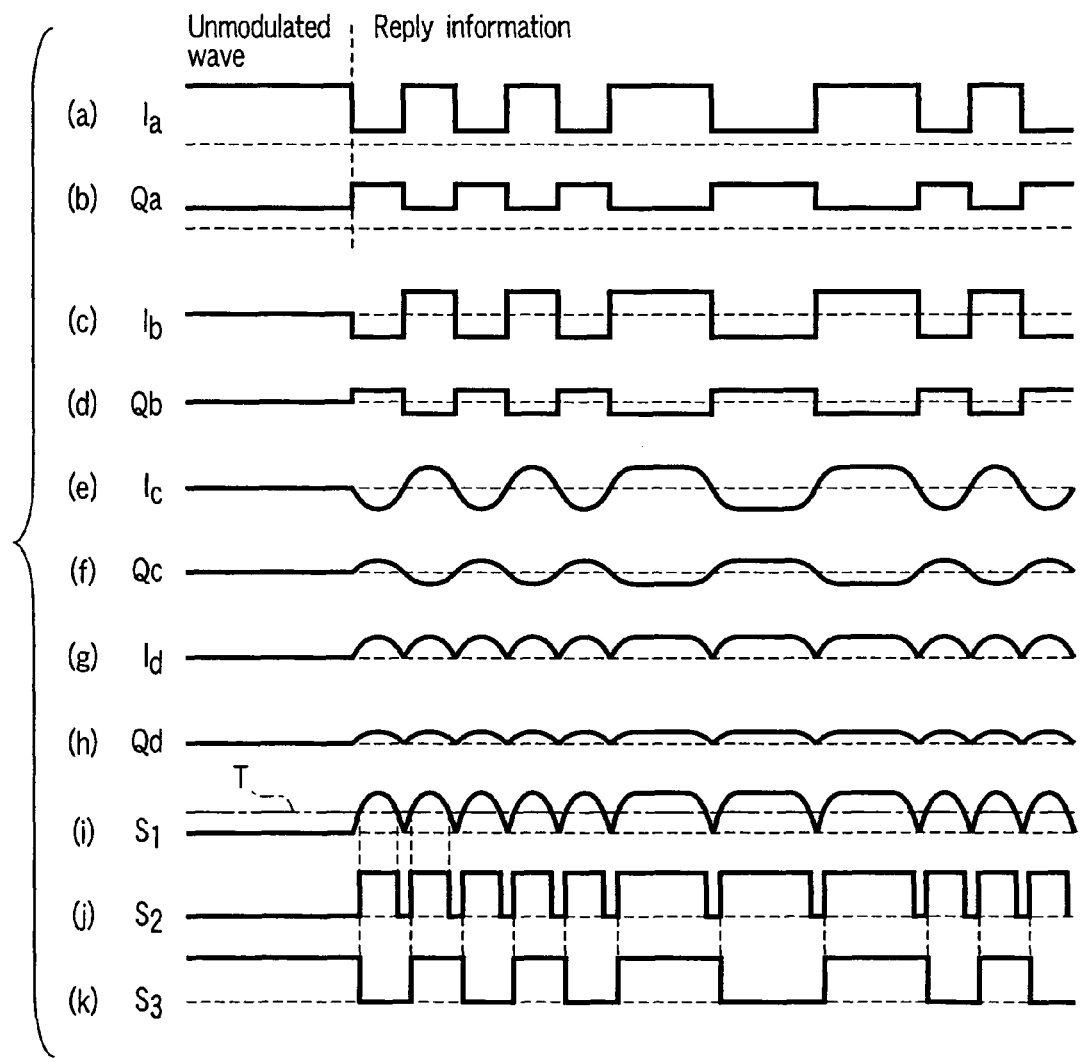
FIG. 4 is a waveform diagram of output signals from relevant portions of the interrogator according to the first embodiment, the diagram illustrating a demodulation process executed by a quadrature demodulator in the interrogator.

The first capacitor 37 removes DC components from the signal Ia from the second LPF 33 to provide a signal Ib shown in (c) of FIG. 4. The I-signal variable gain amplifier 41 then amplifies the signal Ib. The third capacitor 39 further removes DC offset components from the amplifier 41. The fourth LPF 35 removes distant frequency components corresponding to at least an adjacent channel. The fourth LPF 35 then outputs a signal Ic shown in (e) of FIG. 4. The signal Ic is branched and input to the I-signal squaring section 43, which squares the signal Ic to output a signal Id shown in (g) of FIG. 4.

Furthermore, the second capacitor 38 removes DC components from the signal Qa from the third LPF 34 to provide a signal Qb shown in (d) of FIG. 4. The Q-signal variable gain amplifier 42 then amplifies the signal Qb. The fourth capacitor 40 further removes DC offset components from the amplifier 42. The fifth LPF 36 removes distant frequency components corresponding to at least an adjacent channel. The fifth LPF 36 then outputs a signal Qc shown in (f) of FIG. 4. The signal Qc is branched and input to the Q-signal squaring section 44, which squares the signal Qc to output a signal Qd shown in (h) of FIG. 4.

The adding section 45 adds the signals Id and Qd together to provide a signal S1 shown in (i) of FIG. 4. The signal. S1 is input to the comparator 18, which then compares the signal S1 with a threshold T1 for two-level-form conversion and outputs a signal S2 shown in (j) of FIG. 4. The signal S2 is input to the digital signal processing section 12. The digital signal processing section 12 has a data generating section 48 that executes a process of inverting the signal level of the signal S2 when the signal S2 rises to generate a signal S3 shown in (k) of FIG. 4. The signal S3 thus obtained is a demodulation signal of the reception signal subjected to the backscatter modulation and received through the antenna 2.

Thus, the I-signal is squared by the I-signal squaring section 43 so as to have a positive sign. The Q-signal is squared by the Q-signal squaring section 44 so as to have a positive sign. The resultant I- and Q-signals are added together by the adding section 45. The signal S1 resulting from the addition by the adding section 45 is then compared with the threshold T1 by the comparator 18. Consequently, even if the I- and Q-signals have markedly different amplitudes or substantially equal amplitude, the reception signal level in this case is high because the amplitudes of the I- and Q-signals are added together, with the result compared with the threshold T. For example, the amplitude of the reception signal resulting from the comparison is double that obtained when one of the I- and Q-signals having substantially equal amplitude is to be selected.

Thus, in the quadrature demodulator, the I-signal squaring section 43 squares the I-signal, and the Q-signal squaring section 44 squares the Q-signal. The adding section 45 then adds the resultant I- and Q-signals together. The comparator 18 then compares the signal S1 received from the adding section 45 with the threshold T to obtain the signal S2. The data generating section 48 of the digital signal processing section 12 then executes the process of inverting the signal level of the signal S2 at every rising edge of the signal S2. The quadrature demodulator thus demodulates the reception data. Therefore, even with the reduced level of the reception signal, the adverse effects of possible noise can be minimized, enabling a reduction in the erroneous reproduction of the reception data caused by the noise.

Provided that the signal subjected to the backscatter modulation and located at a leading end of reply information is predetermined between the interrogator 1 and the RFID tags 3-1, 3-2, and 3-3 to be inevitably made low, the phase of the demodulation signal can be made the same as that of the backscatter modulation signal by the interrogator 1 by making the reception level high when transmitting the unmodulated signal. This eliminates the need to execute such a process as compares the demodulated signal with data such as preamble to invert the data.

Furthermore, if the received backscatter modulation signal is small and the signal S1, when input to the digital signal processing section 12, has an amplitude of a level lower than the threshold T, the digital signal processing section 12 performs control so as to increase the gains of the variable gain amplifiers 41 and 42. If the received backscatter modulation signal is large and the amplitude of the signal S1 is at a level lower than the threshold T for a very short time, which is shorter than the time interval during which the digital signal sampling section 12 samples the signal S1, then the digital signal processing section 12 performs control so as to reduce the gains of the variable gain amplifiers 41 and 42.

In the present embodiment, the second and third LPFs 33 and 34, which remove high frequency signals, are arranged separately from the fourth and fifth LPFs 35 and 36, which remove distant frequency components corresponding to at least the adjacent channel. However, the present invention is not limited to this. The fourth and fifth LPFs 35 and 36 alone may be provided. Furthermore, in the present embodiment, the first and second capacitors 33 and 34 are arranged separately from the third and fourth capacitors 39 and 40. However, the present invention is not limited to this. The third and fourth capacitors 39 and 40 alone may be provided.

Additionally, in the present embodiment, the comparator 18 uses the preset threshold T for two-level-form conversion. The present invention is not limited to this. A floating slice circuit using an operational amplifier may be used to generate the threshold T for two-level-form conversion. The floating slice circuit utilizes a time constant for capacitors or the like to average the level of the signal S1 in an analog manner to generate the threshold T.

Moreover, in the present embodiment, the data generating section 48 reproduces the reception data by executing the process of inverting the signal level of the signal S2 from the comparator 18 at every rising edge of the signal S2. However, the present invention is not limited to this. The reception data may also be reproduced by executing a process of inverting the signal level of the signal S2 at every falling edge of the signal S2.

Second Embodiment

In the description of the first embodiment, the analog circuit performs the multiplication and addition of the I- and Q-signals. However, in the present embodiment, description will be given of the case in which a digital circuit performs arithmetic operations such as the multiplication of the I- and Q-signals. Components of the second embodiment which perform the same operations as those in the first embodiment are denoted by the same reference numerals, and will not be described in detail.

Figure 5:
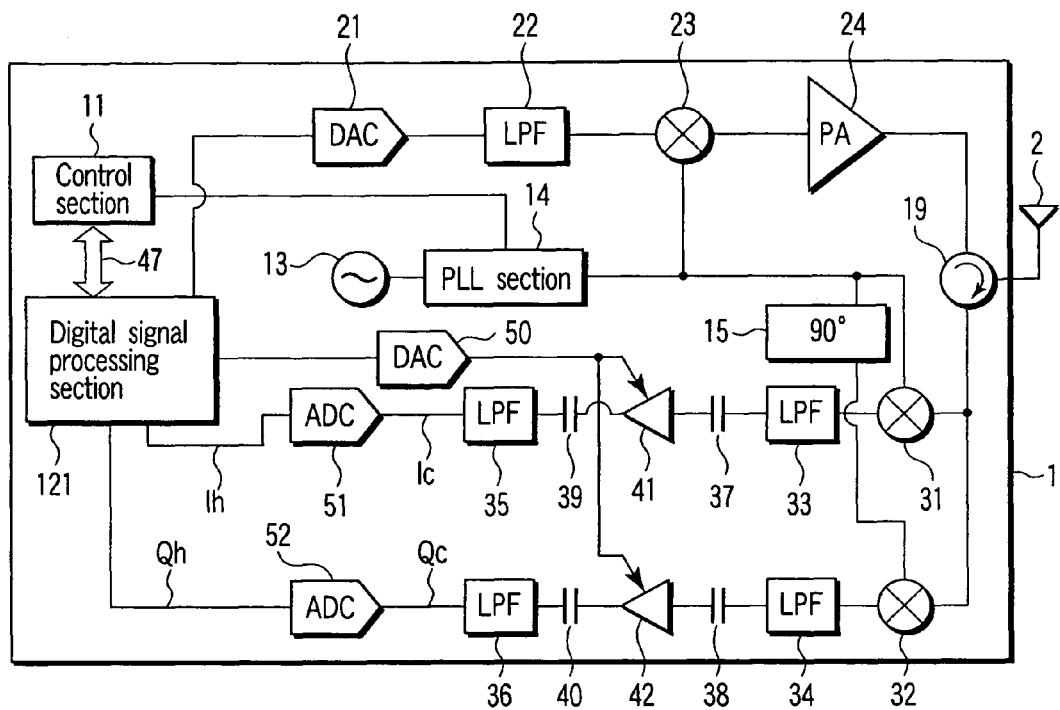
FIG. 5 is a block diagram showing the configuration of an interrogator according to a second embodiment of the present invention.

FIG. 5 is a schematic block diagram showing the configuration of the interrogator 1. The transmission side and local signal generating section of the interrogator 1 are the same as those in the first embodiment. The processing of the I- and Q-signals executed by the reception side is the same as that in the first embodiment from the beginning of the process through the operation performed by the fourth and fifth LPFs 35 and 36. Furthermore, the operation of a digital signal processing section 121 for the transmission side is the same as that in the first embodiment.

The signal Ic from the fourth LPF 35 is supplied to the first analog-to-digital converter (ADC) 51. The signal Qc from the fifth LPF 36 is supplied to the second analog-to-digital converter (ADC) 52. LPFs 35 and 36 remove distant frequency components corresponding to at least the adjacent channel and also functions as an anti-aliasing filter for removing frequency components that are integral multiples of the sampling frequency for the first and second ADCs 51 and 52.

The first ADC 51 converts the signal Ic from the fourth LPF 35 into a digital signal and supplies the digital signal to the digital signal processing section 121. The second ADC 52 converts the signal Qc from the fifth LPF 36 into a digital signal and supplies the digital signal to the digital signal processing section 121.

Figure 6:
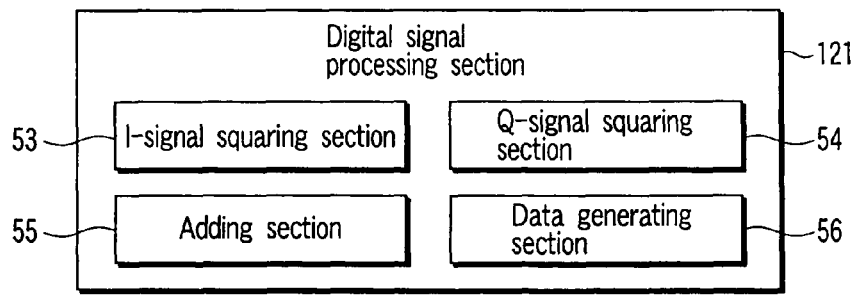
FIG. 6 is a block diagram showing the configuration of an essential part of a digital processing section of the interrogator according to the second embodiment.

The digital signal processing circuit 121 is an integrated circuit, and as shown in FIG. 6, internally has an I-signal squaring section 53 that squares the digital signal from the first ADC 51, a Q-signal squaring section 54 that squares the digital signal from the second ADC 52, an adding section 55 that adds outputs from the squaring sections 53 and 54 together, and a data generating section 56 generating a signal that is at a high level while a signal output by the adding section 55 is equal to or greater than a predetermined threshold, the data generating section 56 further inverts the signal level at every rising edge in the generated signal to generate two-level-form data.

Figure 7:
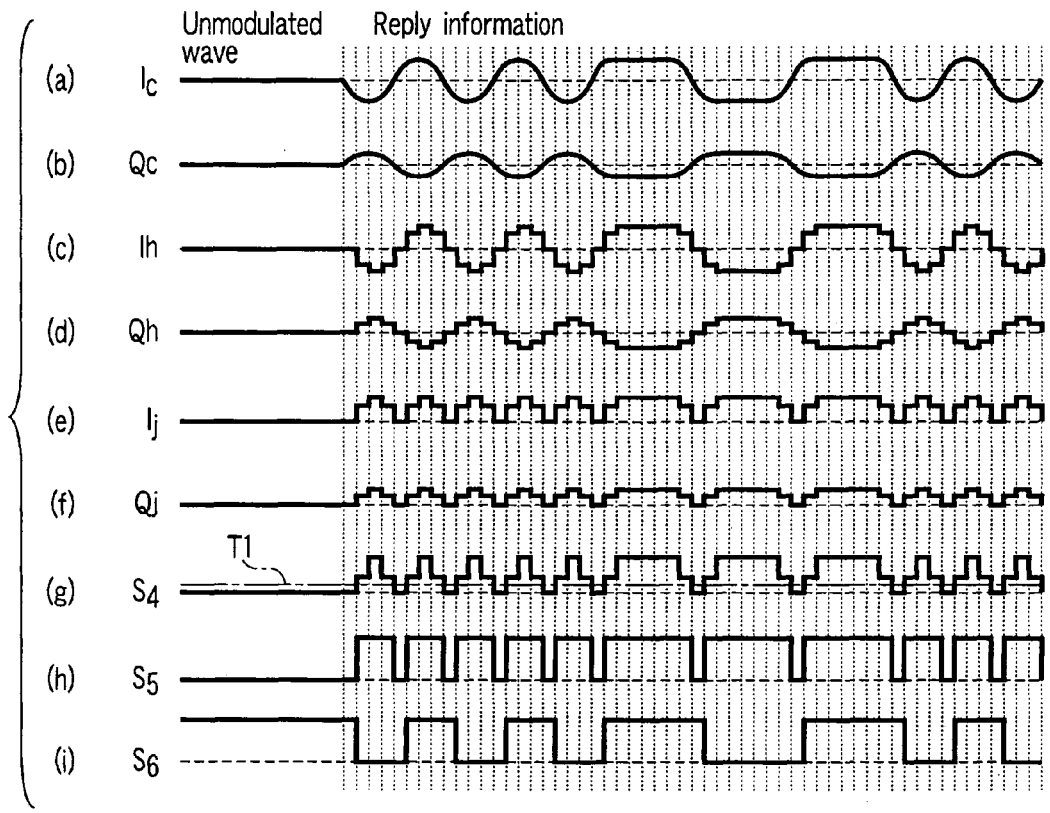
FIG. 7 is a waveform diagram of output signals from relevant portions of the interrogator according to the second embodiment, the diagram illustrating a demodulation process executed by a quadrature demodulator in the interrogator.

FIG. 7 is a diagram showing output waveforms output by relevant portions of the interrogator 1 when the interrogator 1 reproduces reception data. The fourth LPF 35 outputs a signal Ic shown in (a) of FIG. 7. The first ADC 51 then samples and converts the signal Ic into digital data corresponding to a signal Ih shown in (c) of FIG. 7. Furthermore, the fifth LPF 36 outputs a signal Qc shown in (b) of FIG. 7. The second ADC 52 then samples and converts the signal Qc into digital data corresponding to a signal Qh shown in (d) of FIG. 7.

The sampling time interval for the first and second ADCs 51 and 52 needs to be set to be shorter than half of the shortest time during which the modulated reception signal remains unchanged, in order to reliably extract data from the modulated reception signal. Here, the sampling time interval is a quarter of the shortest time during which the modulated reception signal remains unchanged. In other words, the sampling frequency is four times as high as the minimum frequency at which the modulated reception signal remains unchanged.

The signals Ih and Qh from the first and second ADCs 51 and 52 are input to the digital signal processing section 121 for digital signal processing. In the digital signal processing section 121, the I-signal squaring section 53 squares and converts the signal Ih into a signal Ij shown in (e) of FIG. 7. The Q-signal squaring section 54 squares and converts the signal Qh into a signal Qj shown in (f) of FIG. 7. The adding section 55 then adds the signals Ij and Qj together to create a signal S4 shown in (g) of FIG. 7.

The digital signal processing section 121 subsequently uses the data generating section 56 to two-level-form convert the signal S4 on the basis of the threshold T1. That is, the data generating section 56 creates a signal S5 shown in (h) of FIG. 7 by determining the level of the signal S4 to be low when the level is equal to or lower than the threshold T1 and to be high when the level is higher than the threshold T1. Moreover, the digital signal processing section 121 executes a process of inverting the signal level of the signal S5 at a rising edge of the signal S5 to generate a signal S6 shown in (i) of FIG. 7. The digital signal processing section 121 thus obtains the demodulation signal S6 of the backscatter signal received through the antenna 2.

When the amplitude level of the signal S4 from the adding section 55 is lower than the threshold T1, the digital signal processing section 121 controls the output voltage of the DAC 50 so as to increase the gains of the variable gain amplifiers 41 and 42. Furthermore, if the amplitude level of the signal S4 is never lower than the threshold T1, the digital signal processing section 121 controls the output voltage of DAC 50 so as to reduce the gains of the variable gain amplifiers 41 and 42. Furthermore, the digital signal processing section 121 acquires the RSSI value of the received signal on the basis of the amplification factors of the variable gain amplifiers 41 and 42 and the amplitude of the signal S4. On the basis of the RSSI value, the control section 11 performs a carrier sensing operation.

Thus, even when digital processing is executed using the digital signal processing section 121 internally having the I-signal squaring section 53, the Q-signal squaring section 54, the adding section 55, and the data generating section 56, a quadrature demodulator can be provided which reproduces reception data from a signal subjected to backscatter modulation. Thus, as is the case with the above-described embodiment, even with the reduced level of the reception signal, the adverse effects of possible noise can be minimized, enabling the reception data to be reliably demodulated.

In the present embodiment, the digital signal processing section 121 creates signal S5 of two levels from the signal S4 and further creates the demodulation signal S6 from the signal S5. However, the present invention is not limited to this. The demodulation signal S6 may be generated by executing a process of inverting the signal level of the signal S4 when the signal S4 rises with the signal level increasing from a value equal to smaller than the threshold T1 to a value greater than the threshold T1.

Furthermore, in the present embodiment, the sampling frequency for the ADCs 51 and 52 is four times as high as the minimum frequency at which the level of the modulated reception signal remains unchanged. However, increasing the sampling frequency enables an increase in the difference between the frequency component of the modulated reception signal and the sampling frequency. This advantageously facilitates the creation of the anti-aliasing filter.

Furthermore, in the present embodiment, the present threshold T1 is used for two-level-form conversion to create the signal S4. However, the present invention is not limited to this. The data obtained before the two-level-form conversion based on the threshold T1 may be utilized to create the signal S4. As shown in (a) of FIG. 8, the signal S4 may be converted into two levels by using a threshold T2 created from an average value for six consecutive sampling data from the data obtained five samplings before the time of the two-level-form conversion through the sampling data to be converted into two levels.

Figure 8:
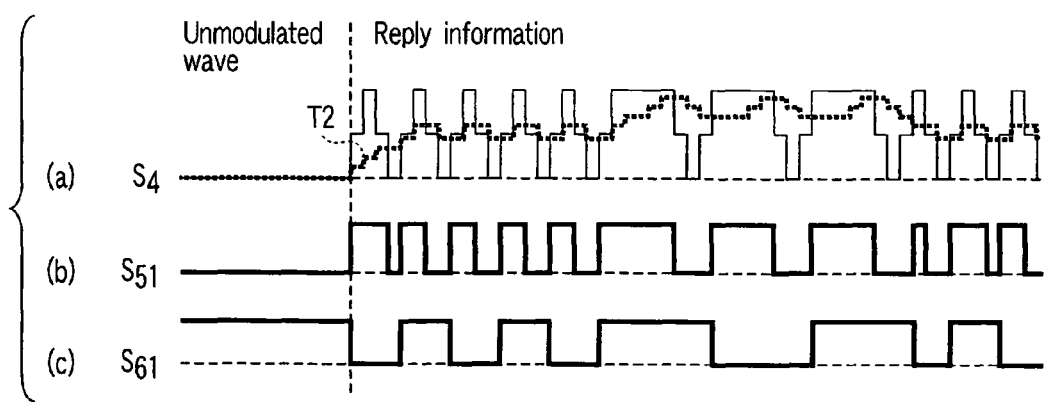
FIG. 8 is a waveform diagram illustrating another example of threshold setting used for two-level-form conversion after an adding process according to the second embodiment.

This varies the threshold T2 depending on the value of the signal S4, which varies over time. The signal S4 is then converted into two levels on the basis of the threshold T2. A signal S51 shown in (b) of FIG. 8 is created by determining the level of the signal S4 to be low when the level is equal to or lower than the threshold T2 and to be high when the level is higher than the threshold T2. The signal level of the signal S51 is then inverted at a rising edge of the signal S51 to generate a signal S61. The demodulation signal S61 of the backscatter signal received through the antenna 2 can thus be obtained.

In this case, the number of consecutive samplings used to calculate the average value needs to be set equal to at least the number of samplings over which ADCs 51 and 52 consecutively obtain the maximum value, plus 1. Then, increasing the number of samplings used to calculate the average value makes it possible to reduce a variation in the level of the threshold T2.

In the present embodiment, the second and third LPFs 33 and 34, which remove high frequency signals, are arranged separately from the fourth and fifth LPFs 35 and 36, which remove distant frequency components corresponding to at least the adjacent channel. However, the present invention is not limited to this. The fourth and fifth LPFs 35 and 36 alone may be provided. In this case, the fourth and fifth LPFs 35 and 36 may remove frequencies that are integral multiples of the sampling frequency for the ADCs 51 and 52. Furthermore, the digital signal processing section 121 may internally perform digital filtering to remove distant frequency components corresponding to at least the adjacent channel.

In the above-described embodiment, a low-noise amplifier may be interposed between the circulator 19 and the second and third mixers 31 and 32.

The present invention can be utilized for radio communications with, for example, a responder called a radio tag or an RFID tag.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A quadrature demodulator which mixes a two-level-form modulated reception signal with a local signal to generate an in-phase signal (I-signal), mixes the reception signal with the local signal having a phase shifted through 90 degrees to generate a quadrature signal (Q-signal), and generates binary data from the I-signal and the Q-signal, the quadrature demodulator comprising:

an I-signal direct current (DC) component removing section which removes a DC component from the I-signal;
an I-signal low-pass filter which removes a frequency component which is higher than a frequency of the I-signal;
an I-signal squaring section which squares the I-signal having passed through the I-signal DC component removing section and the I-signal low-pass filter;
a Q-signal DC component removing section which removes a DC component from the Q-signal;
a Q-signal low-pass filter which removes a frequency component which is higher than a frequency of the Q-signal;
a Q-signal squaring section which squares the Q-signal having passed through the Q-signal DC component removing section and the Q-signal low-pass filter;
an adding section which adds an output from the I-signal squaring section and an output from the Q-signal squaring section together; and
a data generating section which generates two-level-form data whose signal level is inverted every time one of a rising edge and a falling edge occurs in the signal output by the adding section, wherein the rising edge and falling edge each pass a predetermined threshold;
wherein an I-signal variable gain amplifier is provided before the I-signal squaring section, and a Q signal variable gain amplifier is provided before the Q-signal squaring section; and
wherein the I-signal variable gain amplifier and the Q-signal variable gain amplifier control gains in accordance with an amplitude value of the signal output by the adding section.

2. A quadrature demodulator which mixes a two-level-form modulated reception signal with a local signal to generate an in-phase signal (I-signal), mixes the reception signal with the local signal having a phase shifted through 90 degrees to generate a quadrature signal (Q-signal), and generates binary data from the I-signal and the Q-signal, the quadrature demodulator comprising:

an I-signal direct current (DC) component removing section which removes a DC component from the I-signal;
an I-signal low-pass filter which removes a frequency component which is higher than a frequency of the I-signal;
an I-signal squaring section which squares the I-signal having passed through the I-signal DC component removing section and the I-signal low-pass filter;
a Q-signal DC component removing section which removes a DC component from the Q-signal;
a Q-signal low-pass filter which removes a frequency component which is higher than a frequency of the Q-signal;
a Q-signal squaring section which squares the Q-signal having passed through the Q-signal DC component removing section and the Q-signal low-pass filter;
an adding section which adds an output from the I-signal squaring section and an output from the Q-signal squaring section together;
a data generating section which generates two-level-form data whose signal level is inverted every time one of a rising edge and a falling edge occurs in the signal output by the adding section, wherein the rising edge and falling edge each pass a predetermined threshold; and
a carrier sense means for performing carrier sensing on the basis of the amplitude value of the signal output by the adding section.

3. The quadrature demodulator according to claim 1, wherein the predetermined threshold is an average value of the amplitude values of the signal output by the adding section over a given continuous period.

4. The quadrature demodulator according to claim 1, wherein an I-signal analog-to-digital converter is provided before the I-signal squaring section, a Q-signal analog-to-digital converter is provided before the Q-signal squaring section, and a sampling time interval for each of the analog-to-digital converters is shorter than half of a minimum time over which the level of a reception signal remains unchanged.

5. The quadrature demodulator according to claim 2, wherein the predetermined threshold is an average value of the amplitude values of the signal output by the adding section over a given continuous period.

6. The quadrature demodulator according to claim 2, wherein an I-signal analog-to-digital converter is provided before the I-signal squaring section, a Q-signal analog-to-digital converter is provided before the Q-signal squaring section, and a sampling time interval for each of the analog-to-digital converters is shorter than half of a minimum time over which the level of a reception signal remains unchanged.

7. A quadrature demodulating method for mixing a two-level-form modulated reception signal with a local signal to generate an in-phase signal (I-signal), mixing the reception signal with the local signal having a phase shifted through 90 degrees to generate a quadrature signal (Q-signal), and generating binary data from the I-signal and the Q-signal, the method comprising:

removing a direct current (DC) component from the I-signal;
filtering, by a low-pass filter, the I-signal from which the DC component has been removed;
squaring the filtered I-signal;
removing a DC component from the Q-signal;
filtering, by a low-pass filter, the Q-signal from which the DC component has been removed;
squaring the filtered Q-signal;
adding the squared I-signal and the squared Q-signal together; and
generating two-level-form data whose signal level is inverted every time one of a rising edge and a falling edge occurs in the added signal, wherein the rising edge and falling edge each pass a predetermined threshold;
varying a gain of the I-signal and obtaining an I-signal variable gain before squaring the I-signal; and
varying a gain of the Q-signal and obtaining a Q-signal variable gain before squaring the Q-signal;
wherein the I-signal variable gain and the Q-signal variable gain are controlled in accordance with an amplitude value of the added signal.

8. A quadrature demodulating method for mixing a two-level-form modulated reception signal with a local signal to generate an in-phase signal (I-signal), mixing the reception signal with the local signal having a phase shifted through 90 degrees to generate a quadrature signal (Q-signal), and generating binary data from the I-signal and the Q-signal, the method comprising:

removing a direct current (DC) component from the I-signal;

filtering, by a low-pass filter, the I-signal from which the DC component has been removed;

squaring the filtered I-signal;

removing a DC component from the Q-signal;

filtering, by a low-pass filter, the Q-signal from which the DC component has been removed;

squaring the filtered Q-signal;

adding the squared I-signal and the squared Q-signal together;

generating two-level-form data whose signal level is inverted every time one of a rising edge and a falling edge occurs in the added signal, wherein the rising edge and falling edge each pass a predetermined threshold; and performing carrier sensing on the basis of the amplitude value of the added signal.

9. The method according to claim 7, wherein the predetermined threshold is an average value of the amplitude values of the added signal over a given continuous period.

10. The method according to claim 7, further comprising:
analog-to-digital converting the I-signal before squaring the I-signal;
analog-to-digital converting the Q-signal before squaring the Q-signal; and
making a sampling time interval for each of the analog-to-digital converting shorter than half of a minimum time over which the level of a reception signal remains unchanged.

11. The method according to claim 8, wherein the predetermined threshold is an average value of the amplitude values of the added signal over a given continuous period.

12. The method according to claim 8, further comprising:
analog-to-digital converting the I-signal before squaring the I-signal;
analog-to-digital converting the Q-signal before squaring the Q-signal; and
making a sampling time interval for each of the analog-to-digital converting shorter than half of a minimum time over which the level of a reception signal remains unchanged.

13. A quadrature demodulating method for mixing a two-level-form modulated reception signal with a local signal to generate an in-phase signal (I-signal), mixing the reception signal with the local signal having a phase shifted through 90 degrees to generate a quadrature signal (Q-signal), and generating binary data from the I-signal and the Q-signal, the method comprising:

removing a direct current (DC) component from the I-signal;

filtering, by a low-pass filter, the I-signal from which the DC component has been removed;

squaring the filtered I-signal;

removing a DC component from the Q-signal;

filtering, by a low-pass filter, the Q-signal from which the DC component has been removed;

squaring the filtered Q-signal;

adding the squared I-signal and the squared Q-signal together;

generating two-level-form data whose signal level is inverted every time one of a rising edge and a falling edge occurs in the added signal, wherein the rising edge and falling edge each pass a predetermined threshold;

converting the I-signal by an I-signal analog-to-digital converter before squaring the I signal; and converting the Q-signal by a Q-signal analog-to-digital converter before squaring the Q signal;

wherein the predetermined threshold is an average value of the amplitude values of the signal output by an adding section over a given continuous period, and the number of consecutive samplings in the given continuous period is set to the number of samplings, over which the analog-to digital converters consecutively obtain the maximum value, plus 1.

14. A quadrature demodulating method for mixing a two-level-form modulated reception signal with a local signal to generate an in-phase signal (I-signal), mixing the reception signal with the local signal having a phase shifted through 90 degrees to generate a quadrature signal (Q-signal), and generating binary data from the I-signal and the Q-signal, the method comprising:

removing a direct current (DC) component from the I-signal;

filtering, by a low-pass filter, the I-signal from which the DC component has been removed;

squaring the filtered I-signal;

removing a DC component from the Q-signal;

filtering, by a low-pass filter, the Q-signal from which the DC component has been removed;

squaring the filtered Q-signal;

adding the squared I-signal and the squared Q-signal together;

generating two-level-form data whose signal level is inverted every time one of a rising edge and a falling edge occurs in the added signal, wherein the rising edge and falling edge each pass a predetermined threshold;

analog-to-digital converting converter the I-signal before squaring the I-signal, and analog-to-digital converting the Q-signal before squaring the Q-signal; and wherein the predetermined threshold is an average value of the amplitude values of a signal output by an adding section over a given continuous period, and the number of consecutive samplings in the given continuous period is set to the number of samplings, over which analog-to digital converters consecutively obtain the maximum value, plus 1.

* * * * *